(12) United States Patent
Hirler et al.

(10) Patent No.: US 6,528,355 B2
(45) Date of Patent: Mar. 4, 2003

(54) METHOD FOR FABRICATING A TRENCH MOS POWER TRANSISTOR

(75) Inventors: Franz Hirler, Isen (DE); Manfred Kotek, Villach (AT); Joost Larik, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/058,526

(22) Filed: Jan. 28, 2002

(65) Prior Publication Data

US 2002/0094635 A1 Jul. 18, 2002

Related U.S. Application Data

(63) Continuation of application No. PCT/DE00/01647, filed on May 23, 2000.

(30) Foreign Application Priority Data

Jul. 28, 1999  (DE) .......................................... 199 35 442

(51) Int. Cl.[7] ............................................ H01L 21/332
(52) U.S. Cl. ..................... 438/135; 438/137; 438/270
(58) Field of Search .................................. 438/133, 135, 438/136, 137, 138, 173, 212, 268, 270

(56) References Cited

U.S. PATENT DOCUMENTS

| 5,283,201 A | 2/1994 | Tsang et al. |
| 5,605,852 A | 2/1997 | Bencuya |
| 5,637,898 A | 6/1997 | Baliga |
| 5,918,114 A | 6/1999 | Choi et al. |

FOREIGN PATENT DOCUMENTS

| EP | 0 899 791 A2 | 3/1999 |
| WO | WO 97/07548 | 2/1997 |

*Primary Examiner*—Tuan H. Nguyen
(74) *Attorney, Agent, or Firm*—Laurence A. Greenberg; Werner H. Stemer; Gregory L. Mayback

(57) ABSTRACT

A method for fabricating a trench MOS transistor includes the step of at least partly filling the trench with a conductive material which is isolated from the inner surface of the trench by an insulating layer. The insulating layer has a layer thickness that is larger in the region of the lower end of the trench than at the upper end of the trench.

15 Claims, 3 Drawing Sheets

METHOD FOR FABRICATING A TRENCH MOS POWER TRANSISTOR

CROSS-REFERENCE TO RELATED APPLICATION

This application is a continuation of copending International Application No. PCT/DE00/01647, filed May 23, 2000, which designated the United States.

BACKGROUND OF THE INVENTION

FILED OF THE INVENTION

The invention relates to a method for fabricating a trench MOS (Metal Oxide Semiconductor) transistor in which at least one trench is formed in a semiconductor body. The trench is then at least partly filled with a conductive material which is isolated from the inner surface of the trench by an insulating layer. The insulating layer is introduced into the trench in such a way that it has a larger layer thickness in the region of the lower end of the trench than at the upper end of the trench.

Reducing the on resistance is of major importance when developing new generations of DMOS power transistors. Such a reduction of the on resistance makes it possible to reduce the static power loss and at the same time to achieve higher current densities, so that smaller and cheaper chips can be used for the same total current.

For this reason, for a fairly long time now thought has been given to how the on resistance can be reduced in an expedient manner. In principle, this is possible by departing from a planar cell structure and using trench cells. This is because the use of trench cells makes it possible to reduce the channel resistance of a MOS transistor through a significant enlargement of the channel width per unit area. The resistance of the drift path, which is also referred to as the "epi-resistance" since the drift path is preferably situated in an epitaxial layer applied on a semiconductor substrate, can be reduced by using deep trenches (in this respect cf. U.S. Pat. No. 4,941,026).

However, deep trenches presuppose that a thicker insulating layer, which in this case is also referred to as a field plate, is used in the lower region of the trenches than in the upper region, i.e. in the channel region, with the actual gate oxide.

In the development of trench MOS power transistors, achieving the required gate oxide quality is a particular challenge. On the one hand, the gate oxide must be grown on a wide variety of crystal orientations, because the trench bottom and the edge or corner lying at the surface of the semiconductor body must also be coated with an insulating layer, that is to say the gate oxide. Since the rate of oxide growth depends on the crystal orientation, this leads to an undesired widening of the thickness distribution of the gate oxide over the trench. The oxidation of the curved silicon areas causes thinnings in the gate oxide and peaks in the silicon of the semiconductor body. This in turn adversely affects the electrical quality of the gate oxide, because the thinnest location determines the breakdown field strength. However, the conductive gate material, in particular doped polysilicon, must be guided out at some location via the edge in order to electrically connect the material. The gate oxide is particularly at risk of having a breakthrough at this location.

A further goal in the development of trench MOS power transistors is to modulate the electric field spikes in the off-state case in such a way that the avalanche multiplication occurs in the semiconductor body and not at an interface. This is because the avalanche breakdown at the interface between semiconductor body and gate oxide would lead to the injection of hot charge carriers into the gate oxide and, consequently, a drifting of the component.

The previous methods for fabricating such trench MOS power transistor cells, in which an insulating layer is thicker in the lower region of the trench than in the upper region, are relatively complicated.

One example thereof is described in U.S. Pat. No. 5,326,711. In this known method, by way of example, polycrystalline silicon has to be deposited three times in total in the fabrication process in order to configure the trench in the desired manner.

In a method disclosed in Published European Patent Application No. EP 0 666 590 A2 or in U.S. Pat. No. 5,783,491, the quality of the gate dielectric is improved through the use of two-fold oxidation ("sacrificial oxide") and etching-away of the oxide. This achieves a certain rounding of the silicon edges.

SUMMARY OF THE INVENTION

It is accordingly an object of the invention to provide a method for fabricating a trench MOS power transistor which overcomes the above-mentioned disadvantages of the heretoforeknown methods of this general type and with which it is possible to fabricate a trench with a thicker insulating layer in a lower region than in an upper region in a simple manner.

With the foregoing and other objects in view there is provided, in accordance with the invention, a method for fabricating a trench MOS power transistor, the method includes the steps of:

forming a trench in a semiconductor body;

coating walls and a bottom of the trench with a first insulating film of a given final thickness by applying the first insulating film as a plurality of thermally oxidized and deposited layers;

filling a lower end of the trench with an auxiliary layer;

removing the first insulating film in regions not coated with the auxiliary layer;

removing the auxiliary layer;

growing a second insulating film on uncovered walls at an upper end of the trench such that the second insulating film is thinner than the given final thickness of the first insulating film;

filling the trench at least partly with a conductive material such that the conductive material is insulated from an inner surface of the trench by the first insulating layer and the second insulating layer; and introducing source zones and body zones into the semiconductor body and providing metallization layers for providing contacting connections.

In other words, in the case of the method for fabricating a trench MOS power transistor, in which at least one trench is introduced into a semiconductor body, which trench is then at least partly filled with a conductive material which is isolated from the inner area of the trench by an insulating layer, the insulating layer being introduced into the trench in such a way that it is provided with a larger layer thickness in the region of the lower end of the trench than at the upper end thereof, the object of the invention is achieved by virtue of the fact that:

(a) the at least one trench is introduced into the semiconductor body, (b) the walls and the bottom of the trench are coated with a first insulating film, which is formed as a multi-layer system of thermally oxidized and deposited layers;

(c) the lower end of the trench is filled with a first auxiliary layer, (d) those parts of the first insulating film which are not coated with the first auxiliary layer are removed, (e) the auxiliary layer is removed, (f) a second insulating film, which is thinner than the final thickness of the first insulating film, is grown on the uncovered walls of the trench, (g) the trench is filled with the conductive material, and (h) source and body zones are introduced into the semiconductor body, and metallization layers are provided for contact connection of these zones.

If the intention is to prevent the removal of the first insulating film in specific regions, which may be the case at the edge, then a further auxiliary layer is applied as masking in these regions. It is also possible to depart from the order specified, for example by making the source and body zones first.

With the method according to the invention, a structure is proposed which both alleviates the critical locations with regard to gate oxide quality and, in the active region, permits modulation of the field distribution through the use of a trench field plate. The actual MOS structure of the transistor with the gate oxide is situated in the upper part of a trench. In the lower part of the trench, the dielectric (field plate) is thicker than the gate oxide. As a result, a higher voltage can be dropped across the dielectric, which permits deeper trenches and a lower on resistance Ron. The transition between gate oxide and field plate oxide is preferably graduated. An abrupt transition would lead to unfavorable field spikes in the silicon. The trenches can be provided both in cells and strips and in any other geometric forms.

In step (c) above, the trench can also be filled with the first auxiliary layer and etched back, so that the first auxiliary layer remains at the lower end of the trench.

The gate material is routed to the surface of the semiconductor body via thick oxide, which means that the electric field strength in the oxide is alleviated at critical edges.

For the semiconductor body, a silicon substrate which is highly doped with boron may preferably be used as starting material, onto which a p-conducting epitaxial layer with a dopant concentration of $1 \times 10^{14}$ to $1 \times 10^{18}$ charge carriers $cm^{-3}$ is deposited. The etching of the trench can then be performed in a customary manner with the aid of a patterned trench mask, which is composed of silicon dioxide, for example. After the fabrication of the trenches, this trench mask is removed.

The trenches themselves may be embodied as strips or else as lattices for a cell structure. In this case, the width of the trenches should be greater than twice the width of a first insulating film that is applied later and is made, for example, of silicon dioxide (field oxide).

This first insulating film is applied with a layer thickness which depends on the voltage class for which the trench MOS transistor cell is intended to be used. In this case, the layer thickness may range from below 0.1 μm to a few μm. If the intention is to avoid steps of the insulating film at the later upper edge thereof, then it is expedient to use a multilayer system for the first insulating film, that is to say to configure the first insulating film from a plurality of layers including, for example, thermal silicon dioxide through thermal oxidation of the trench-etched semiconductor body and a deposited silicon dioxide (TEOS). As an alternative, these materials can also be used for the first insulating film if the latter includes only one layer.

By way of example, a photoresist may advantageously be used for the first auxiliary layer, which photoresist firstly extends to above the silicon edge of the semi-conductor body and is then etched back in the trenches to below the so-called "body lower edge", an n-conducting well in the p-conducting epitaxial layer. When photoresist is used for the auxiliary layer, a thermal treatment ("postbake") is preferably performed.

If inactive trenches are intended to be produced then the corresponding regions of the first insulating film may be masked with a further auxiliary layer. Photoresist, for example, may be used for this further auxiliary layer.

After the application of the auxiliary layer, the first insulating film is etched isotropically in a wet-chemical manner, for example, so that the first insulating film remains only below the first auxiliary layer. Afterward, the first auxiliary layer is removed. The gate insulating layer made, for example, of silicon dioxide, the so-called gate oxide, is then grown, whose layer thickness is between a few nm to in excess of 100 nm depending on the intended threshold voltage of the trench MOS transistor cells. What is important, however, is that this gate insulating layer which forms the second insulating film is thinner than the end thickness of the insulating film.

Apart from one exception, the further fabrication of the trench MOS transistor cell is effected in a customary manner:

The body region, masked by the first insulating film or by a dedicated phototechnology, is made by using an implantation and an out-diffusion. The gate material, in particular poly-crystalline silicon, is then deposited and doped. After a patterned etching-back of the gate material to below the silicon upper edge of the semiconductor body, the gate material may, if appropriate, subsequently be sealed with an insulating layer made of silicon dioxide, in order to prevent outdiffusion of dopants. This order of diffusion of the body region and patterning and/or sealing of the gate material could, if appropriate, also be changed, i.e. reversed.

It is now advantageous if a so-called "body reinforcement", is introduced. This is preferably done by implantation of an $n^+$-conducting zone in the n-conducting body region, if the semiconductor substrate is p-conducting. It goes without saying that the respective conduction types can also be reversed. This body reinforcement brings about a reduction of the breakdown voltage of the MOS transistor cell at the step between the first thicker insulating film and the second thinner insulating film, i.e. at the so-called oxide step in the trench. A preferred dopant concentration for the body reinforcement is about $1 \times 10^{18}$ charge carriers $cm^{-3}$.

The body reinforcement, which is preferably implanted, and further dopings may also be introduced at a different point in time, for example at the start of the process.

There then follows an implantation of the source zone, in which case this implantation can be masked by the first insulating film or a dedicated phototechnology. After the deposition of a dielectric made, for example, of silicon dioxide for the insulation of gate a source metallization layer, the contact holes are etched.

A masked implantation of an $n^{++}$-conducting body contact, which, if appropriate, is performed for each trench MOS transistor cell, is followed by the customary metal deposition using, for example, aluminum for the source zone and the body contact. The metallization layer applied through the use of the metal deposition is then patterned, whereupon a passivation may also follow.

Another mode of the method according to the invention includes, subsequent to coating the walls and the bottom of the trench with the first insulating film, applying a silicon nitride layer on the first insulating film and patterning the silicon nitride layer.

Yet another mode of the method according to the invention includes providing the silicon nitride layer with a layer thickness of substantially 20 nm.

Another mode of the method according to the invention includes the step of patterning the auxiliary layer and the first insulating film by using a single photoresist layer and a mask and by exposing the single photoresist layer only down to a given depth.

A further mode of the method according to the invention includes the step of covering inactive trenches by introducing a first photoresist layer into the inactive trenches and patterning the first insulating film by using a second photoresist layer applied outside the first photoresist layer.

Another mode of the method according to the invention includes the step of applying the second photoresist layer subsequent to applying the first photoresist layer.

To summarize, the invention has in particular the following advantages:
- good gate oxide quality through alleviation of edges and corners; nowhere in the transistor is gate material routed via gate oxide at critical edges;
- thick oxide of the first insulating film in the bottom of the trench in order to withstand high drain-gate voltages;
- stepped transition between first and second insulating films along a trench for high voltages at the edge; and
- field plate effect through the deep trench for reducing the Ron component of the body or drift zone.

Other features which are considered as characteristic for the invention are set forth in the appended claims.

Although the invention is illustrated and described herein as embodied in a method for fabricating a trench MOS power transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
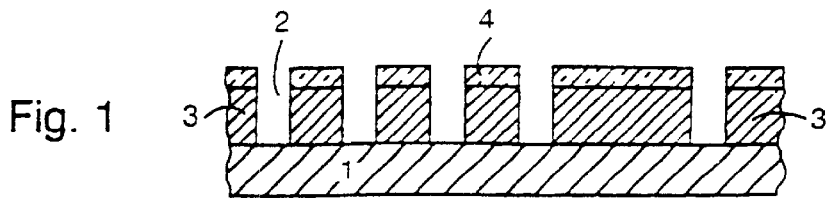
FIGS. 1 to 7 are diagrammatic, partial sectional views of a semiconductor configuration illustrating the sequence of a first exemplary embodiment of the method according to the invention.

Referring now to the figures of the drawings in detail and first, particularly, to FIG. 1 thereof, there is shown a $p^+$-conducting silicon substrate 1, to which a p-conducting silicon layer 3 is applied epitaxially, into which layer trenches 2 are etched with the aid of a silicon dioxide layer 4 or another suitable material as mask, which trenches essentially reach as far as the silicon substrate 1 and can penetrate into the latter. However, smaller depths of the trenches 2 are also possible.

It is also possible, if appropriate, to apply a sacrificial oxide in order to increase the interface mobility, and then to remove it again.

The silicon substrate 1 and the layer 3 may both be doped with boron, the dopant concentration in the layer 3 being about $1\times10^{14}$ to $1\times10^{18}$ charge carriers $cm^{-3}$.

After the etching of the trenches 2, the silicon dioxide layer 4 serving as trench mask is removed.

A first silicon dioxide film 5 is then deposited as field oxide with a layer thickness which depends on the voltage class sought for the MOS transistor cell, as has been explained above. Preferred layer thicknesses lie between 0.1 $\mu$m and a few $\mu$m. In order to avoid oxide steps (cf. above) and in order to produce gently rising oxide edges, it is also possible to provide for the field oxide a plurality of layers including, for example, thermally oxidized silicon dioxide through oxidation of the trench-etched semiconductor body and deposited silicon dioxide (TEOS) or LPCVD oxide (Low Pressure Chemical Vapor Deposition).

The desired beveling of the oxide or the graduated transition from gate oxide to field plate oxide is produced by the higher wet-chemical etching rate of the LPCVD oxide compared with the thermal oxide. The thickness of the two layers is chosen such that the oxide in the trench bottom withstands the voltage requirements of the transistor.

Figure 2:
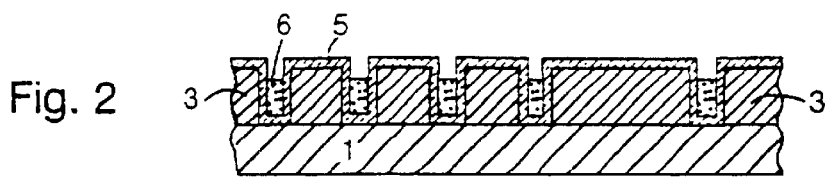

An auxiliary layer 6 made, for example, of photoresist is then applied to above the edge of the semiconductor body, cured and etched back, so that only "plugs" remain below the body lower edge in the trenches 2. When photoresist is used for the auxiliary layer 6, a thermal treatment ("postbake") follows. The structure shown in FIG. 2 is thus obtained.

For an edge construction, for example, it is then possible to perform an additional masking through the use of a further auxiliary layer 7 made of photoresist, which is exposed and developed, as a result of which, in the case of subsequent etching-back, the field oxide 5 remains below the further auxiliary layer 7.

Figure 3:
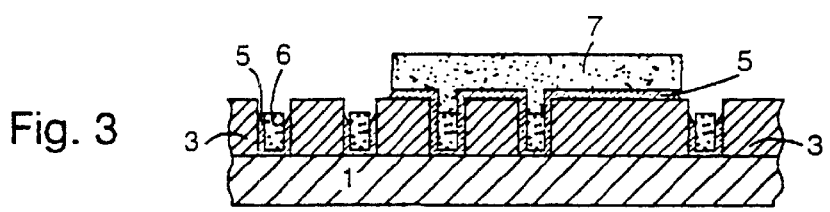

Isotropic wet-chemical etching of the field oxide 5 then follows, so that the field oxide remains only below the auxiliary layer 6 in the regions that are not covered by the further auxiliary layer 7. The structure shown in FIG. 3 is thus obtained.

The two trenches below the auxiliary layer 7 are so-called "inactive" trenches in contrast to the remaining "active" trenches. The inactive trenches serve, for example, for electrical connection of the gates, as gate fingers and—as already mentioned—for the edge construction.

The two auxiliary layers 6 and 7 are then removed, i.e. the photoresist is stripped.

Afterward, a gate insulating film 5' made of silicon dioxide is grown, which is thinner than the first insulating film 5, a step ("oxide step") 33 thereby being produced in the trenches 2. This step 33 may be beveled if a plurality of layers are used for the first insulating film 5, as has already been explained above. The angle of the beveled step 20 with respect to the perpendicular may be 17°, for example. It goes without saying, however, that other angles are also possible.

The gate insulating layer 5' is provided with a layer thickness of a few nm to in excess of 100 nm depending on the intended threshold voltage of the trench MOS transistor cell. At any rate, however, the layer thickness of the gate insulating layer 5' is smaller than the end thickness of the first insulating film 5.

Figure 4:
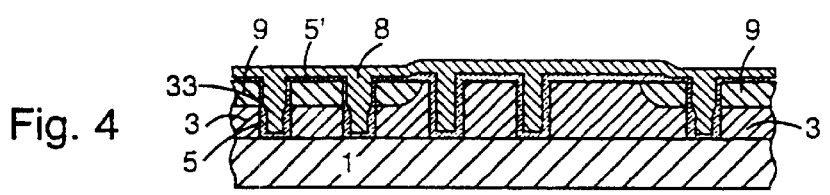

Implantation and outdiffusion of an n-conducting body region 9 then follows, in which case this implantation can be masked by the field oxide 5 or 5' or by a dedicated phototechnology. Gate material 8 made, for example, of polycrystalline silicon is then deposited and doped, as a result of which the structure shown in FIG. 4 is obtained.

Figure 5:
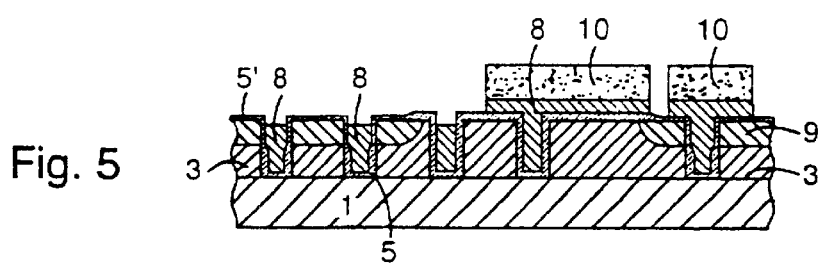

The gate material 8 is then patterned with the aid of a masking layer 10 made, for example, of photoresist and etched back to below the silicon upper edge, to produce the structure illustrated in FIG. 5.

Figure 6:
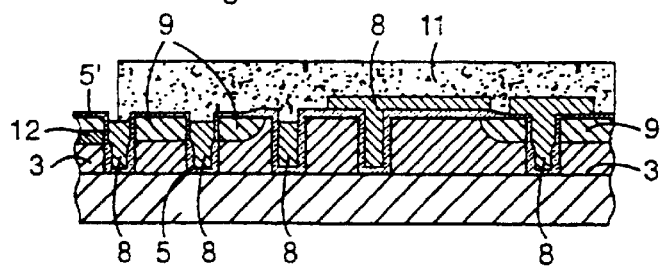

After the removal of the masking layer 10, the polycrystalline material 8 may be sealed with the aid of, for example, a thin silicon dioxide layer (not shown in the drawings), in order to prevent outdiffusion of dopants from the polycrystalline material 8. There then follow the application of a photoresist layer 11 with uncritical sidewall over the polycrystalline material 8 on the left in FIG. 6 and also implantation and, if appropriate, annealing of an n$^+$-conducting body reinforcement zone 12 in the region of the oxide step 33, in order to reduce the breakdown voltage of the trench MOS transistor cell below the breakdown voltage at the oxide step 33 in the trench 2. The dopant concentration in this zone 12 is preferably about $1 \times 10^{18}$ charge carriers cm$^{-3}$. The structure shown in FIG. 6 is thus present.

Figure 7:
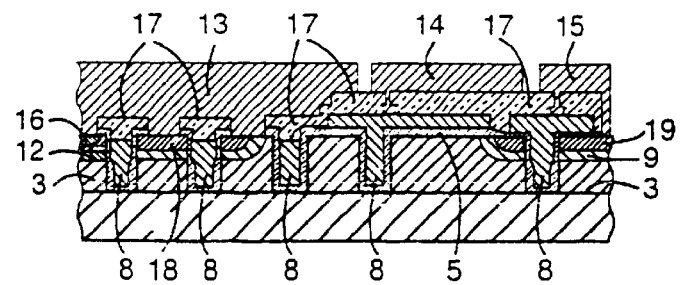

Finally, a p$^{++}$-conducting source zone 18 and a p$^{++}$-conducting diffusion zone 19 are additionally introduced, in a manner masked by the field oxide or by a dedicated phototechnology. An insulating layer 17 made of borophosphorous silicate glass is then applied, densified and patterned by etching contact holes. After masked implantation of an n++-conducting body contact zone 16, a metallization layer (electrode) 13 for a source, a metallization layer (electrode) 14 for a gate and a metallization layer 15 are deposited and patterned, as a result of which, after passivation, the structure shown in FIG. 7 is finally obtained.

Figure 8:
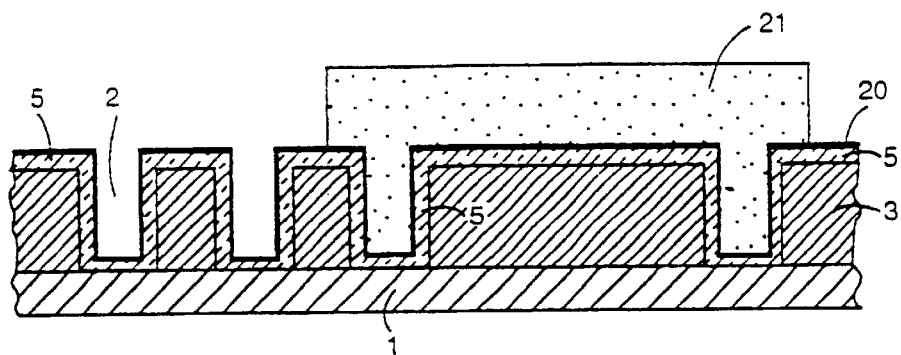
FIGS. 8 to 10 are diagrammatic, partial sectional views of a semiconductor configuration illustrating the sequence of a second exemplary embodiment of the method according to the invention.
Figure 9:
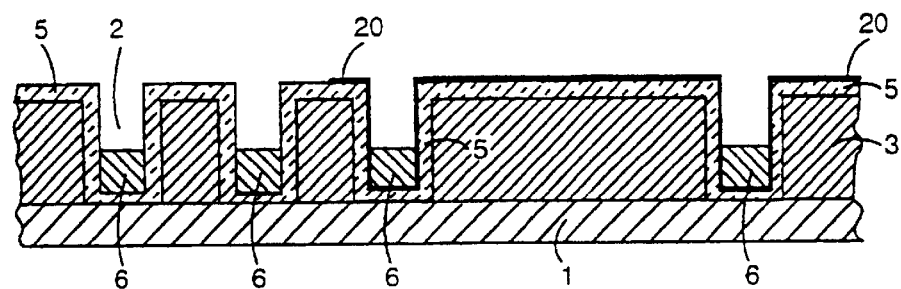
Figure 10:
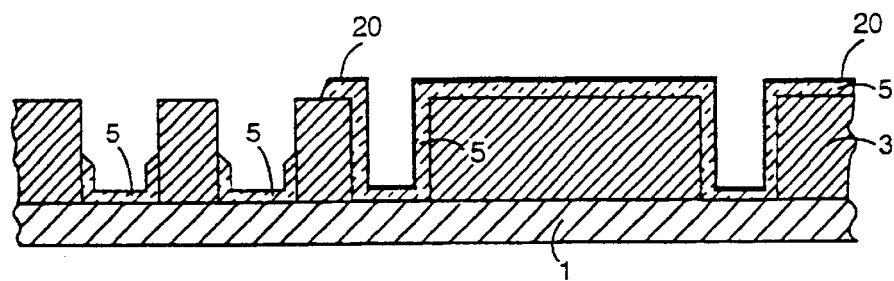

FIGS. 8 to 10 show a variant of the method according to the invention, in which, after the application of the first insulating film 5 and before the provision of the auxiliary layer 6, a thin silicon nitride layer with a layer thickness of 20 nm, for example, is applied on the insulating film 5 (cf. FIG. 8) and patterned with the aid of a resist layer 21, so that the silicon nitride layer 20 remains only in the regions below the resist layer 21. What is thus achieved is that the silicon nitride layer 20 remains only in the region of the inactive trenches. After resist coating and etching-back, the configuration shown in FIG. 9 is obtained, in which the auxiliary layer 6 including resist plugs remains in the trenches.

During a subsequent wet-chemical silicon oxide etching, the insulating film 5 made of silicon dioxide in the trench bottoms of the active trenches is masked by the auxiliary layer 6 and the inactive trenches in their entirety are masked through the use of the silicon nitride layer 20. After the removal of the silicon nitride layer 20 and the auxiliary layer 6, the process result is the same as in the first exemplary embodiment before the provision of the second insulating film 5'.

Figure 11:
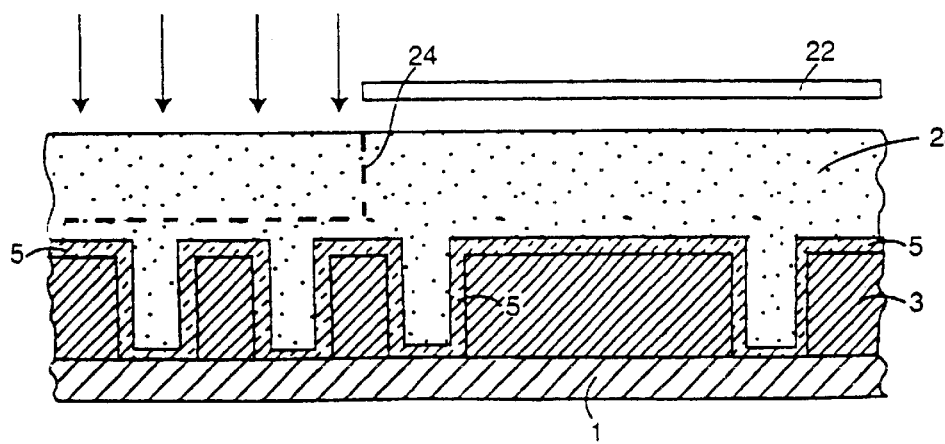
FIGS. 11 and 12 are diagrammatic, partial sectional views of a semiconductor configuration illustrating the sequence of a third exemplary embodiment of the method according to the invention.
Figure 12:
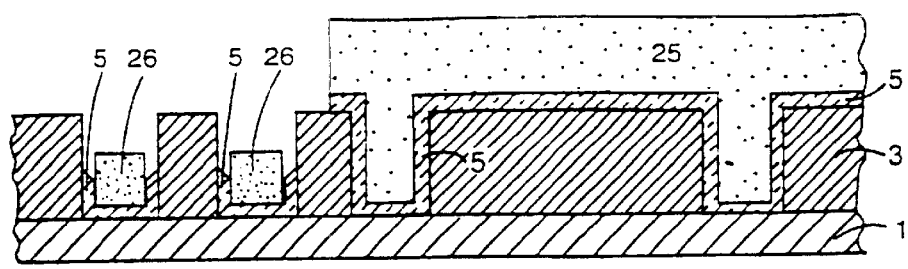

FIGS. 11 and 12 illustrate a third exemplary embodiment of the method according to the invention, in which the patterning of the first insulating film 5 in the active trenches and the inactive trenches is performed through the use of a single phototechnology. In this case, a resist layer 23 with a layer thickness of 4 μm, for example, is exposed through the use of a mask 22 only down to a specific depth (cf. the dashed line 24). The exposed part of the resist layer 23 is removed. After further stripping of the surface region of the resist layer 23, all that remains are resist plugs 26 as auxiliary layer 6 and a resist layer 25 with a layer thickness of about 1.5 μm above the inactive trenches. This further process of stripping the resist layer 23 in order to obtain the resist plugs 26 and the resist layer 25 can be effected for example by plasma etching-back (cf. FIG. 12). If appropriate, a dry development can also be performed instead of such plasma etching-back.

Figure 13:
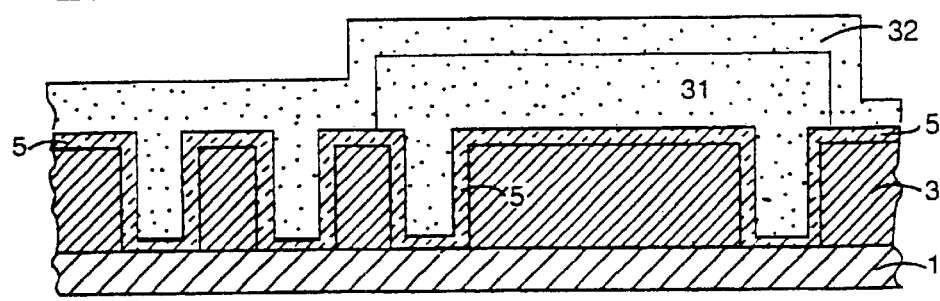
FIGS. 13 and 14 are diagrammatic, partial sectional views of a semiconductor configuration illustrating the sequence of a fourth exemplary embodiment of the method according to the invention.
Figure 14:
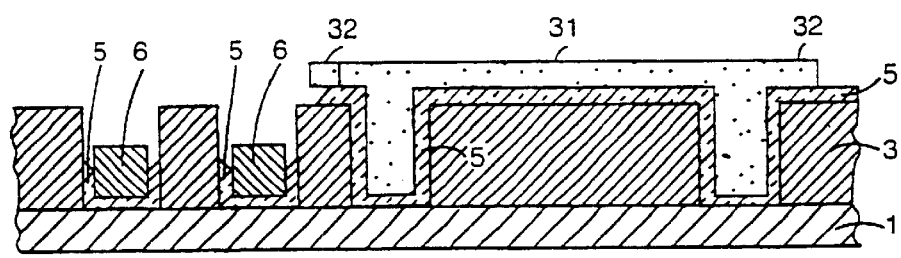

FIGS. 13 and 14 show sections for illustrating a further variant of the method of the invention according to a fourth exemplary embodiment. In this exemplary embodiment, inactive trenches are covered through the use of a first photoresist layer 31, while the necessary topography, i.e. patterning of the first insulating film 5, is performed with the aid of a second photoresist layer 32. As a result, a configuration is obtained in which the auxiliary layer 6 remains in the form of resist plugs in the active trenches while the inactive trenches are filled with the photoresist layer 31. After the removal of the auxiliary layer 6 and the residues of the photoresist layers 31 and 32, the further processing is effected as in the first exemplary embodiment.

Figure 15:
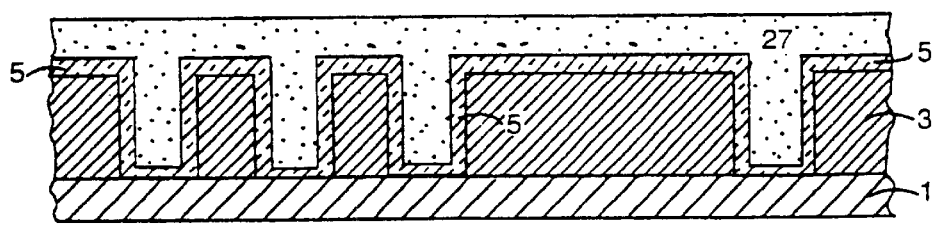
FIGS. 15 to 17 are diagrammatic, partial sectional views of a semiconductor configuration illustrating the sequence of a fifth exemplary embodiment of the method according to the invention.
Figure 16:
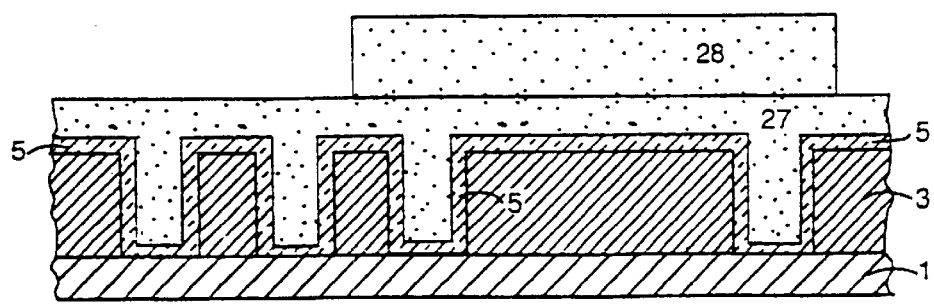
Figure 17:
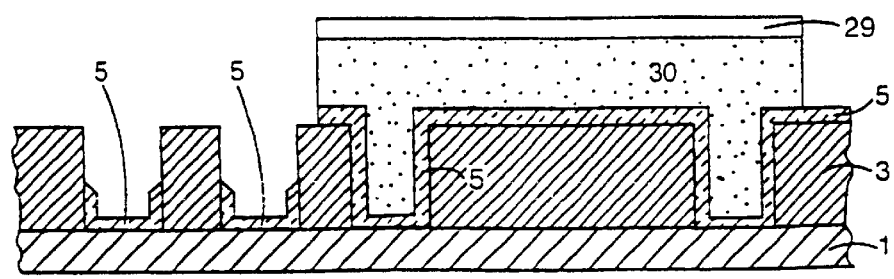

Finally, FIGS. 15 to 17 show sections for elucidating a further variant of the method according to the invention in a fifth exemplary embodiment, which is similar to the fourth exemplary embodiment. Here, too, two phototechnologies are used but here a patterning photoresist layer 28 with a layer thickness of about 3 μm is produced only after the application of a photo-resist layer 27 with a layer thickness of about 1 μm. The structure thus obtained is shown in FIG. 16. After the removal of substantial parts of the photoresist layer 28 and of the photoresist layer 27, all that remain are photoresist layers 29 (as residue of the photoresist layer 28) and 30 (as residue of the photo-resist layer 27), so that the configuration shown in FIG. 17 is present. This removal of substantial parts of the photoresist layers 27 and 28 can again be effected by plasma etching-back or dry development. Finally, the remaining parts 29 and 30 of the photoresist layers 28 and 27 are stripped in order that the configuration then obtained is processed further in the same way as in the first exemplary embodiment.

We claim:

1. A method for fabricating a trench MOS power transistor, the method which comprises:
    forming a trench in a semiconductor body;
    coating walls and a bottom of the trench with a first insulating film of a given final thickness by applying the first insulating film as a plurality of thermally oxidized and deposited layers;
    filling a lower end of the trench with an auxiliary layer;
    removing the first insulating film in regions not coated with the auxiliary layer;
    removing the auxiliary layer;
    growing a second insulating film on uncovered walls at an upper end of the trench such that the second insulating film is thinner than the given final thickness of the first insulating film;
    filling the trench at least partly with a conductive material such that the conductive material is insulated from an inner surface of the trench by the first insulating layer and the second insulating layer; and introducing source zones and body zones into the semiconductor body and providing metallization layers for providing contacting connections.

2. The method according to claim 1, which comprises forming the trench in an epitaxial layer provided on a semiconductor substrate.

3. The method according to claim 2, which comprises providing the epitaxial layer with a dopant concentration of $1\times10^{14}$ to $1\times10^{18}$ charge carriers cm$^{-3}$.

4. The method according to claim 1, which comprises forming trenches in the semiconductor body such that the trenches are one of strip-shaped and lattice-shaped.

5. The method according to claim 1, which comprises applying the first insulating film with a layer thickness of substantially 0.1 μm to several μm.

6. The method according to claim 1, which comprises using a photoresist as the auxiliary layer.

7. The method according to claim 1, which comprises applying a further auxiliary layer as an additional masking for an edge construction such that the further auxiliary layer prevents a removal of the first insulating film in masked regions.

8. The method according to claim 1, which comprises applying the second insulating film with a layer thickness of a few nm to in excess of 100 nm.

9. The method according to claim 1, which comprises introducing a reinforcement into a body region.

10. The method according to claim 9, which comprises implanting the reinforcement.

11. The method according to claim 1, which comprises, subsequent to coating the walls and the bottom of the trench with the first insulating film, applying a silicon nitride layer on the first insulating film and patterning the silicon nitride layer.

12. The method according to claim 11, which comprises providing the silicon nitride layer with a layer thickness of substantially 20 nm.

13. The method according to claim 1, which comprises patterning the auxiliary layer and the first insulating film by using a single photoresist layer and a mask and by exposing the single photoresist layer only down to a given depth.

14. The method according to claim 1, which comprises covering inactive trenches by introducing a first photoresist layer into the inactive trenches and patterning the first insulating film by using a second photoresist layer applied outside the first photoresist layer.

15. The method according to claim 14, which comprises applying the second photoresist layer subsequent to applying the first photoresist layer.

* * * * *